United States Patent [19]
Adams

[11] 4,430,626
[45] Feb. 7, 1984

[54] NETWORKS FOR THE LOG DOMAIN

[75] Inventor: Robert W. Adams, Medford, Mass.

[73] Assignee: dbx, Inc., Newton, Mass.

[21] Appl. No.: 355,712

[22] Filed: Mar. 8, 1982

Related U.S. Application Data

[63] Continuation of Ser. No. 97,901, Nov. 28, 1979, abandoned.

[51] Int. Cl.³ .......................... G06G 7/24; H04B 1/64
[52] U.S. Cl. .............................. 331/108 B; 307/492;
328/127; 328/145; 331/177 R
[58] Field of Search ...................... 307/490, 492, 503;
328/127, 144, 145, 167; 331/177 R, 135, 108 B;
333/14

[56] References Cited

U.S. PATENT DOCUMENTS

| | | | |
|---|---|---|---|
| 3,714,462 | 1/1973 | Blackmer | 328/145 |
| 3,781,693 | 12/1973 | Ford | 307/492 X |
| 4,101,849 | 7/1978 | Blackmer et al. | 333/14 |
| 4,225,794 | 9/1980 | Buff | 307/492 X |
| 4,250,470 | 2/1981 | Szarvas | 333/14 |

Primary Examiner—Siegfried H. Grimm
Assistant Examiner—Edward P. Westin
Attorney, Agent, or Firm—Schiller & Pandiscio

[57] ABSTRACT

A network operates in the log domain so as to filter logarithmic signals and has a signal-controlled variable system frequency response. A method is also described for constructing such networks so that they function substantially identical to equivalent RC networks.

9 Claims, 17 Drawing Figures

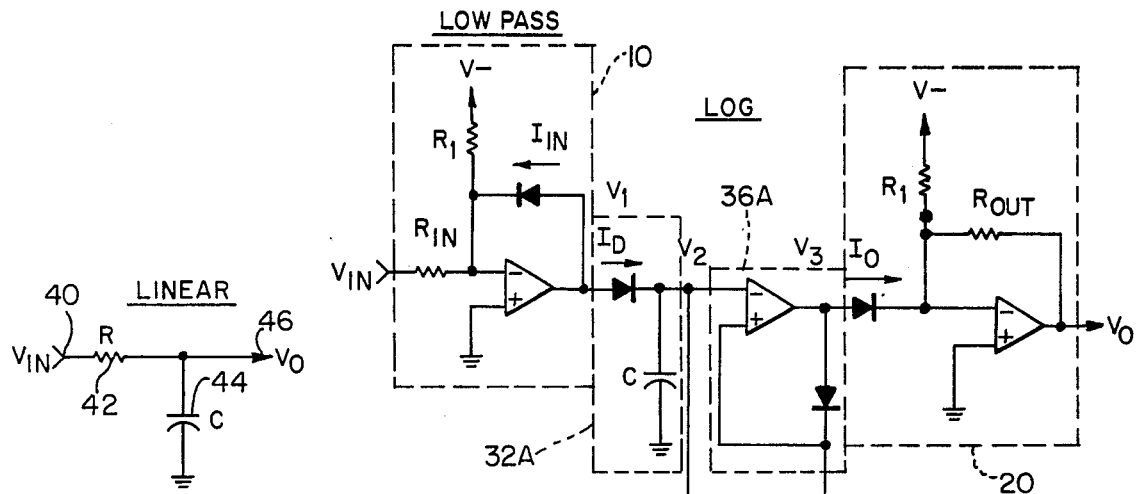
FIG. 2A
FIG. 2B
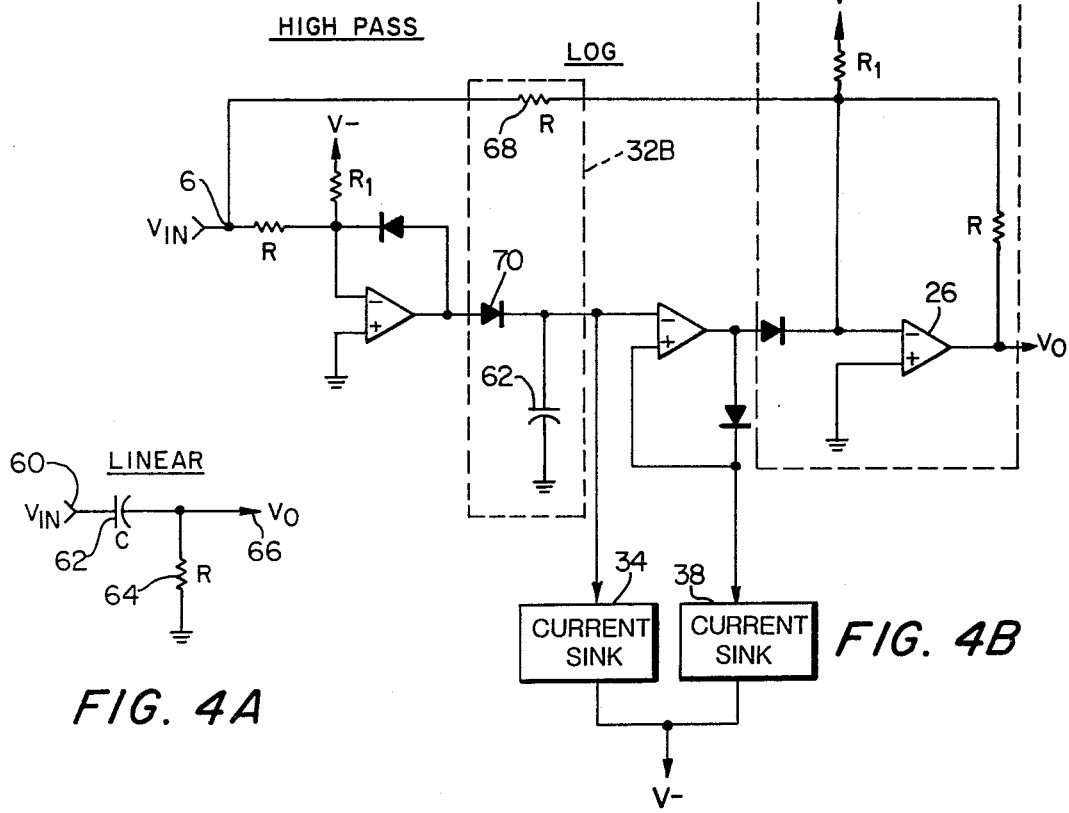
FIG. 4A
FIG. 4B

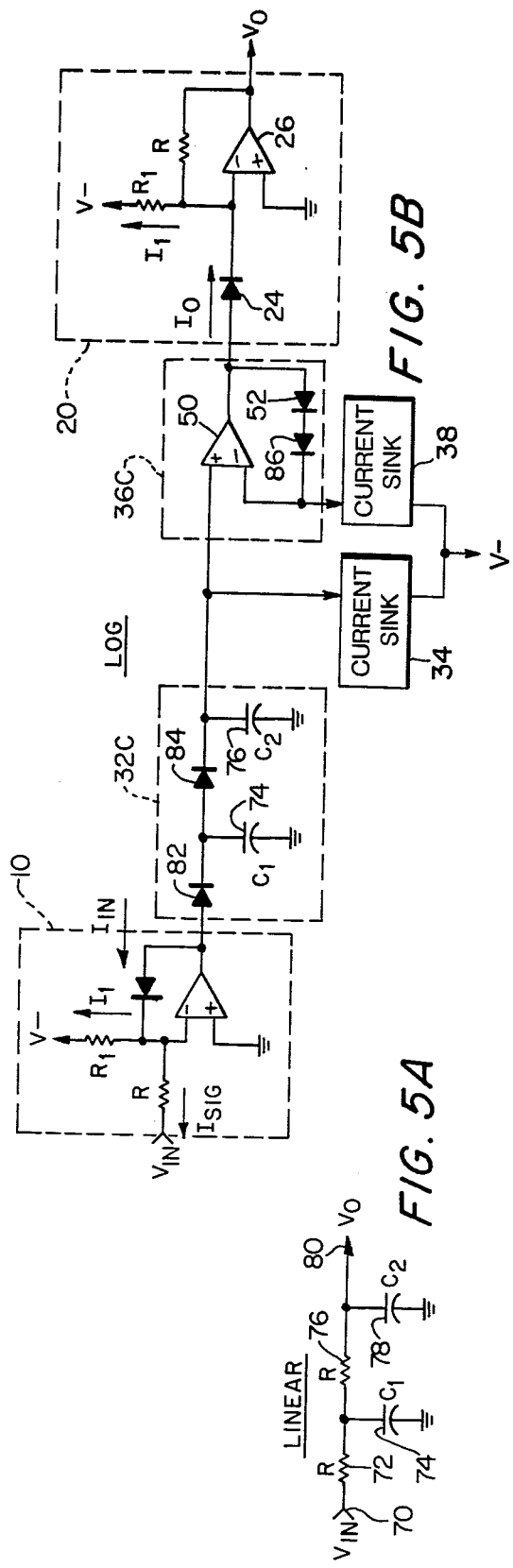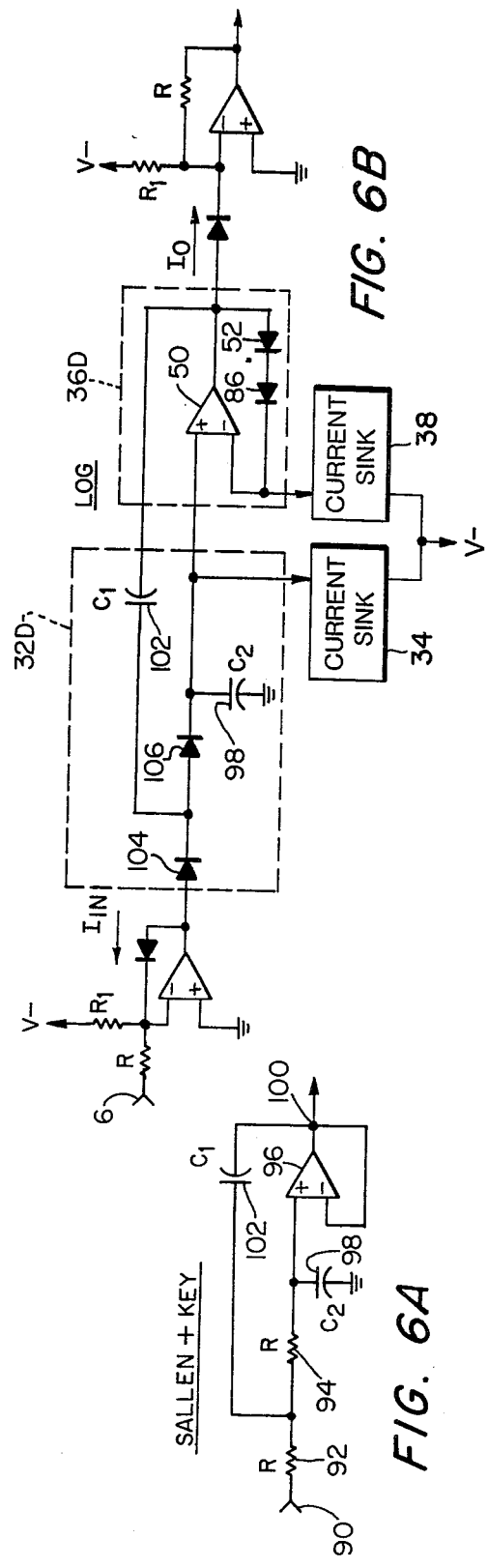

NETWORKS FOR THE LOG DOMAIN

RELATED APPLICATION

This application is a continuation application of my prior application U.S. Ser. No. 097,901 filed Nov. 28, 1979, now abandoned.

The present invention generally relates to systems having a signal-controllable system frequency response and more particularly to systems designed to operate as filters for log signals and having a system frequency response directly controllable by a control signal.

Systems having a signal-controllable system frequency response are generally well known and vary in design. Such systems include filtering systems in which the gain of a portion of the transmission band of the system varies as a function of the frequency content of the input signal so as to adapt the system to the particular nature of the input signal. The latter type of systems are described in U.S. Pat. No. 4,101,849 issued July 18, 1978, and U.S. Pat. No. 4,136,314 issued Jan. 23, 1979, (both to Blackmer et al and both assigned to DBX, Inc., the assignee of the present invention) and the references cited therein. Other such adaptive systems are described in British specification Nos. 643,574; 645,256; 656,545; 1,305,622; 1,356,848; 1,367,002; and 1,393,690.

There are several other classic design approaches including signal-controllable filters and amplifiers having a signal-controllable frequency response. Such designs include those comprising FET transistors and those that employ transconductance amplifiers. See, for example, Weber, Samuel, editor, *Circuits for Electronics Engineers*, Electronics Magazine Book Series, McGraw-Hill, Inc., New York, N.Y., 1977, pages 131–144. The latter two design approaches, however, have inherent drawbacks such as limited frequency and amplitude control range and excessive signal distortion. Further, each of the systems are typically designed for linear behavior, i.e. a response at the output of the system to a sum of excitations at the input to the system is equal to the sum of the responses to the excitations acting separately; the multiplication of the excitation by a constant multiplier the response by the same constant. This can easily be illustrated in audio signal processing systems where any filtering of the signal is typically done directly to the input audio signal or some signal linearly related to the input audio signal by transmitting either signal through an appropriate linear RC network. As a consequence, when signals are processed through nonlinear systems, such as systems for performing various mathematical functions, the original signal is typically processed through the nonlinear system, and then transformed so that it can be processed through the linear RC network. For example, where it is desirable to operate on a signal in accordance with a mathematical function such as multiplication, the original signal is typically converted to a log signal, i.e., a signal which is a function of the logarithm of the original signal. The original signal is thus transformed from what for convenience is termed herein as the "linear domain" to what for convenience is termed herein as the "log domain". The multiplier signal can then be summed with the log signal to provide a combined signal, and the latter subsequently converted to an antilog signal i.e., a signal which is a function of the antilogarithmic of the combined signal. An example of a multiplier circuit which has met with great commercial success, particularly in audio applications, is described and claimed in U.S. Pat. No. 3,714,462 issued to David E. Blackmer on Jan. 30, 1973, (hereinafter referred to as the "Blackmer circuit"). Filters which include RC networks are typically employed on the original signal or the antilog signal, since the latter two signals are in the linear domain. An attempt to employ the same RC networks in the log domain would not provide the desired system frequency response since the log domain is nonlinear in nature. Similar systems comprising RC networks, such as oscillators must also operate in a linear domain in order to provide the desired frequency response.

It is an object of the present invention to provide a new design approach for systems having a signal-controlled system frequency response.

A more specific object of the present invention is to provide an improved signal-controllable frequency responsive system exhibiting a relatively greater frequency and amplitude control range and reduced signal distortion.

Another specific object of the present invention is to provide an improved network design technique for nonlinear systems so that the systems behave in a linear manner.

And another specific object of the present invention is to provide a network design approach for designing networks adapted to filter log signals so that the system within which the network is used, operates in a linear manner.

Still another specific object of the present invention is to provide an improved design technique for nonlinear systems having a particular signal-controllable system frequency response and capable of having signal-controllable signal gain.

Yet another specific object of the present invention is to provide networks for use with log signals and having a signal-controllable system frequency response substantially identical to RC networks for use with linear signals.

These and other objects of the present invention are provided by a novel technique of designing circuits for filtering log signals. Each circuit is adapted to filter log signals operate and has a signal-controlled system frequency response substantially identical to an equivalent circuit for use with linear signals.

Other objects will be obvious and will in part appear hereinafter. The invention accordingly comprises the processes involving the several steps and the relation and order of one or more of such steps with respect to each of the others; and the apparatus possessing the construction, combination of elements, and arrangement of parts which are exemplified in the following disclosure, and the scope of the application of which will be indicated in the claims.

For a fuller understanding of the nature and objects of the present invention, reference should be had to the following detailed description taken in connection with the accompanying drawings wherein:

FIG. 1 shows a partial block and a partial schematic diagram of a system incorporating the principles of the present invention;

FIGS. 2A and 2B respectively show in schematic form, a known linear low pass filter network and the equivalent log network designed in accordance with the present invention for use in the log domain;

FIGS. 3A and 3B respectively show the network section of FIG. 2B and the corresponding AC equivalent model;

FIGS. 4A and 4B respectively show in schematic form, a known linear high-pass filter network and the equivalent log filter network designed in accordance with the present invention for use in the log domain;

FIGS. 5A and 5B respectively show in schematic form a known linear cascaded filter network and the equivalent log filter network designed in accordance with the present invention for use in the log domain;

FIGS. 6A and 6B respectively show in schematic form, a known Sallen and Key linear filter network and the equivalent log filter network designed in accordance with the present invention for use in the log domain;

FIGS. 7A and 7B respectively show in schematic form, a known state variable linear filter network and the equivalent log filter network designed in accordance with the present invention for use in the log domain;

In the drawings the same numerals refer to similar parts.

Figure 1:
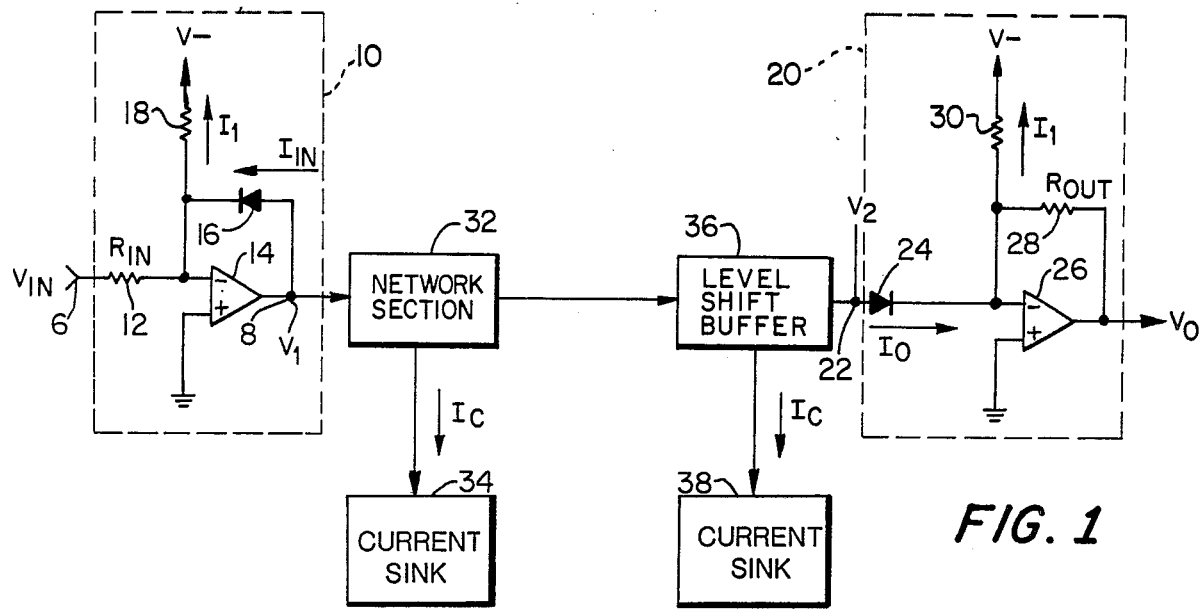

In accordance with the present invention a network is designed so that when placed between a log converter and an anti-log converter, i.e., in the log domain, the system will function in a manner which is equivalent to utilizing log and anti-log converters and an equivalent linear filter coupled to the converters in the linear domain. In particular, referring to FIG. 1 the log converter 10 can be any type of device known in the art, such as the one employed in the Blackmer circuit for providing a voltage signal $V_1$ at its output terminal 8 in accordance with a logarithmic function of the input voltage signal Vin applied to the input terminal 6. As shown converter 10 has its input terminal 6 connected to input resistor 12 (Rin), which in turn is connected to the inverting input of operational amplifier 14. The non-inverting input of amplifier 14 is grounded, while the output terminal of amplifier 14 is connected to the anode of feedback diode 16, the latter having its cathode connected to the inverting input terminal of amplifier 14 so as to form a log amplifier as well known. The inverting input of the amplifier is suitably biased with a negative D.C. voltage applied through resistor 18.

The antilog converter 20 is also well known in the art and includes means for converting the input log signal $V_2$ to an output signal $V_o$, the latter being related to the input signal $V_2$ in accordance with an antilogarithmic function. As schematically shown the input terminal 22 of antilog converter 20 is connected to the anode of diode 24 which in turn has its cathode connected to the inverting input terminal of operational amplifier 26. The non-inverting input of amplifier 26 is grounded while the output of the amplifier is connected through feedback resistor 28 to its inverting input with the latter being biased by a negative D.C. signal applied through biasing resistor 30. In accordance with the present invention the output $V_1$ of the log converter 10 is applied to the input of a log network section 32 having a response frequency programmed by a control signal $I_c$ from current source 34. As shown, source 34 provides a negative current and therefore functions as a current sink. Where D.C. coupling is desired between network 32 and antilog converter 20 the output of section 32 is applied to a level shifter/buffer section 36 which modifies the D.C. amplitude level of the output of the network section 32 in accordance with the current drawn from current source 38 (also shown as a current sink) to provide the output $V_2$, which in turn drives the antilog converter 20. The section 36 and current sink 38 may be omitted where AC coupling between network 32 and antilog converter 20 is preferred.

The above description will become more clear from a description of examples of embodiments designed in accordance with the present invention.

Referring to FIG. 2A, a single linear RC low pass filter for use in the linear domain is shown. Specifically, the input terminal 40 of the filter is connected to resistor 42 which in turn is connected to ground through capacitor 44 and to the output terminal 46. The filter can be described in accordance with the following differential equation.

$$V_o + RC\, V_o' = V_{in} \quad (1)$$

wherein $V_o$ = the output voltage at terminal 46 (volts);

R = the value of resistor 42 (ohms);

C = the value of capacitor 44 (farads);

$V_o'$ = first derivative of the output voltage with respect to time (volts/sec); and $V_{in}$ = the input voltage applied to input terminal 40.

In accordance with the present invention, the network section 32 of FIG. 1 should be designed so that the relationship between the output voltage $V_o$ of the antilog converter 20 and the input $V_{in}$ at terminal 6 is the same as that of equation (1) so that the system of FIG. 1 provides the same system frequency response as that provided by the linear filter of FIG. 2A.

Figure 3A:
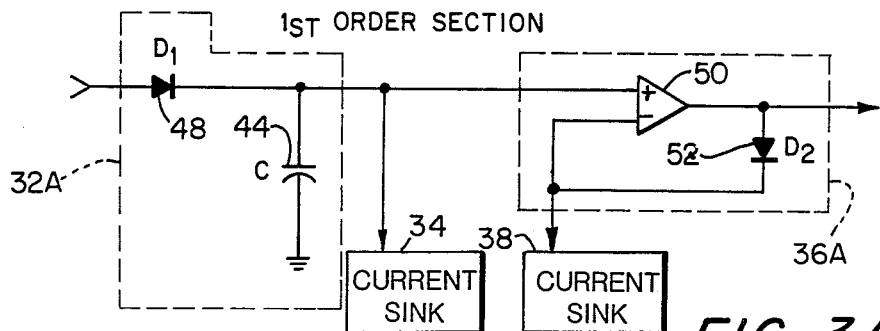

In accordance with the present invention, it will be more evident hereinafter that log filter network section 32A shown in FIG. 3A is in some ways similar in construction to and is the log filter equivalent of the linear RC lowpass filter of FIG. 2A. In particular the resistor 42 is replaced with a diode 48, which in turn is biased by the control current Ic from sink 34, and the level shift buffer 36A is added to account for the voltage drop across diode 48. In particular buffer 36A includes operational amplifier 50 having its non-inverting input connected to receive the output of network 32A, its inverting input to receive the biasing currnt Ic from sink 38 and its output forming the output of buffer 36A. The output of the amplifier 50 is connected to the anode of feedback diode 52, the latter having its cathode connected to the inverting input of the amplifier.

It can be shown that the filter network section 32A and buffer 36A of FIG. 3A when placed between the log converter 10 and antilog converter 20 as shown in FIG. 2B will provide a system response equivalent to the first order lowpass filter of FIG. 3A wherein the cut-off frequency of the log filter network is proportional to the control current Ic from sink 34.

The equivalent log-filter network 32A can be derived by using the simplified Ebers Moll equations for a transistor at room temperature. More particularly, referring to FIG. 1 using the Ebers Moll equations the following relationships can be derived:

$$V_1 = \frac{1}{40} \ln \frac{I_{in}}{I_s} \text{ or} \tag{2a}$$

Solving for Iin, $$I_{in} = I_s e^{(40\,V_1)} \tag{2b}$$

wherein
$V_1$=the voltage output of the log converter 10;
ln=the symbol for the natural logarithm function;
$I_{in}$=the input current drawn through the feedback diode 16 of log converter 10;
$I_s$=the reverse saturation current of diode 48 of filter network 32A; and
e=the symbol for the exponential function.
and $$V_2 = \frac{1}{40} \ln \frac{I_o}{I_s}, \text{ or} \tag{3a}$$

Solving for Io, $$I_o = I_s e^{(40\,V_2)} \tag{3b}$$

wherein
$V_2$=the input voltage to the antilog converter 20; and
$I_o$=the output current through diode 24 of antilog converter 10.

Substituting equations (2b) and (3b) into equation (1), the following relationship exists $$I_s e^{40V_2} + RCI_s\{e^{(40V_2)}\}' = I_s e^{(40V_1)} \tag{4a}$$

Dividing both sides by Is, $$e^{(40V_1)} = RC\{e^{(40V_2)}\}' + e^{40V_2} \tag{4b}$$

In the general case, if the desired filter characteristic of the system of FIG. 1 is defined by the differential equation $$K_1 V_o + K_2 V_o' \ldots = P_1 V_{in} + P_2 V_{in}' \ldots \tag{5}$$

then the equation defining the log filter network section 36 must be in the general form $$K_1 e^{V_o} + K_2 (e^{V_o})' \ldots = P_1 e^{V_o} + P_2 (e^{V_o})' \ldots \tag{6}$$

Figure 3B:
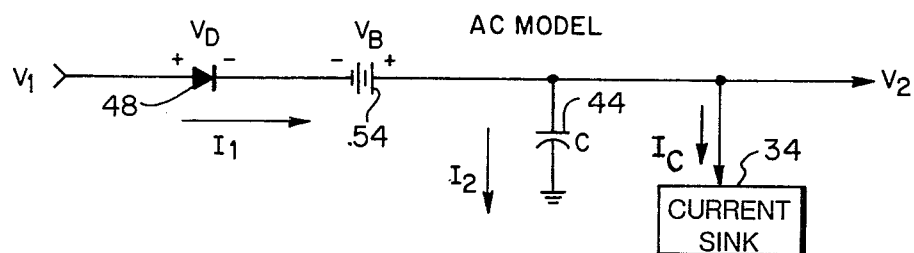

The analysis of the system can be further simplified by using the A.C. model of network 32A shown in FIG. 3B. In the A.C. model a D.C. battery 54 is added by connecting the negative terminal of the battery to the cathode of diode 46 and the positive terminal of the battery 54 to capacitor 44. The D.C. level $V_b$ of the battery is equal to the quiescent drop across diode 48. The relationship between voltage and current in this diode-battery combination can be expressed as follows:

$$V_1 - V_2 = V_D - V_B = \tag{7}$$

-continued $$\frac{1}{40} \ln\left(\frac{I_1}{I_s}\right) - \frac{1}{40} \ln\left(\frac{I_c}{I_s}\right) = \frac{1}{40} \ln\left(\frac{I_1}{I_c}\right)$$

wherein
$V_1$=the voltage input to the network section 32A;
$V_2$=the voltage output of section 32A;
$V_D$=the voltage drop across diode 48;
$V_B$=the bias voltage of battery 54;
$I_1$=the input current through diode 48;
$I_c$=the applied control current from sink 34; and
$I_s$=the reverse saturation current of diode 48.
Solving equation (7) for $I_1$ $$I_1 = I_c e^{40(V_1 - V_2)} \tag{8}$$

Further, in accordance with Kirchhoff's Law $$I_1 = I_2 + I_c, \tag{9}$$

and it is known that $$I_2 = CV_2' \tag{10}$$

wherein
C=the value of capacitor 44 and
$V_2'$=the first derivative of $V_2$ as a function of time.
Substituting equations (8) and (10) into equation (9)

$$I_c e^{40(V_1 - V_2)} = CV_2' + I_c \tag{11}$$

Multiplying by the factor, $e^{40V_2}$, equation (11) becomes $$I_c e^{40V_1} = CV_2' e^{40V_2} + I_c e^{40V_2} \tag{12}$$

or, $$e^{40V_1} = (C/40I_c)(e^{40V_2})' + e^{40V_2} \tag{13}$$

Intuitively, when the diode 48 conducts small currents the dynamic impedance of the diode is equal to $1/(40I_c)$ since at such current levels the diode is operated over a linear portion of its voltage-current characteristic curve and the entire circuit will function as a linear network. It is therefore clearly seen that equation (13) is identical to equation (4b) and that the network 32A shown in FIG. 3A can be placed with buffer 36A between log converter 10 and antilog converter 20 as shown in FIG. 2B to provide the equivalent first order lowpass filter of that shown in FIG. 2A when the control current $I_c$ from sink 34 is properly set at a level to provide the same cut-off frequency. Referring to equation (13) it will be readily apparent that the cut-off frequency $f_c$ is a function of term $C/40I_c$, and in particular $$f_c = \frac{40I_c}{2\pi C} \tag{14}$$

It should also be noted that the constant term of equation (14), derived from the Ebers Moll equations, is derived from the quantity KT/q, wherein T is the operating temperature of diode 48. Equation (14) is therefore valid only at room temperature. The cut-off frequency defined by equation (14) will actually vary in proportion to absolute temperature of the operating diode in degrees Kelvin. This effect can be greatly reduced by using complementary temperature compensation in the current source as well known in the art.

It will be appreciated that the first order filter section shown in FIG. 3A provides a D.C. coupling to the antilog converter 20.

A first order highpass filter may be easily derived from the los pass filter section of FIG. 3A. More particularly, the first order high pass filter for use in the linear domain is illustrated in FIG. 4A. The input terminal 60 of the filter is connected to capacitor 62 which in turn is connected directly to the output terminal 66 and through resistor 64 to ground. The first order high pass filter of FIG. 4A is thus provided by interchanging the capacitor and the resistor of the FIG. 2A low pass filter. However, interchanging the diode 46 and capacitor 44 of FIGS. 2B and 3A in the log network section 32B with appropriate current biasing will not provide a useful high pass filter. Instead the system shown in FIG. 4B is identical to the system shown in FIG. 2B, with diode 70 and capacitor 62 being respectively connected in the same manner as diode 48 and capacitor 44, as shown in FIG. 3A, except that a resistor 68 is connected between the input 6 of the log converter 10 and the inverting input of amplifier 26 of the antilog converter 20. The effect of resistor 68 connected in this fashion is to subtract the low frequency signal energy content passed by the low filter section formed by diode 48 and capacitor 44 from the signal content of the entire signal, leaving the high frequency signal energy content at the output of the antilog converter 20. It will be appreciated that by controlling the cut-off frequency of the low pass filter section formed by diode 7A and capacitor 62, the cut-off frequency of the overall high pass filter section 32B is being controlled. Further, resistor tolerance should be small so as to provide high stop-band attenuation.

It will be appreciated that by utilizing the techniques of the present invention it is possible to implement more complex network configurations. Generally, the design approach for most log domain filter networks is to select a prototype linear low pass RC filter section. If feedback within the log domain is to be used, a unity gain configuration should be selected. If possible, a linear prototype is chosen in which all the resistors are of equal value.

Next the values of the resistors and the capacitors of the prototype are chosen so as to provide the desired frequency response, keeping in mind that the values of the resistors in the linear prototype will equal $1/40I_c$ in the log domain model, where $I_c$ equals the nominal value of the control current.

The equivalent log filter network is then designed by replacing all the resistors in the linear prototype with diodes biased by the appropriate control current having a nominal value equal to $1/40R$, where R is the value of the resistor of the prototype. If the values of R in the prototype are not the same, more than one current source will be necessary for each resistor having a different value. Further, the design of the level shifter buffer will depend upon whether AC or DC coupling into the antilog converter is desired. Although the various filters are described as utilizing a diode for each resistor of the corresponding linear prototype, it will be appreciated that most diodes have relatively poor logarithmic characteristics and accordingly where a diode is described a transistor connected in a diode mode should be employed. Preferably, when utilizing transistors connected in a diode mode for the diodes of the log filter network, they should be matched for their $V_{be}$ characteristics. If the transistors are not matched, an offset control can be included to null the output voltage offset in a manner well known in the art.

Finally, a mathematical analysis of the circuit may be performed to derive the differential equation describing the particular log domain section. With respect to some log sections, a non-linear term will appear in the equation. This non-linear term is representative of a second harmonic distortion product when the input frequency approaches the cut-off frequency determined by the control current. The magnitude of this distortion term is a function of the input current level, and in those situations where this error term appears in the equation, the magnitude of the distortion is typically less than 1%. Generally, the mathematical analysis technique should be approached in a systematic way to determine the differential equation and the error term, if any. The preferred analysis is as follows:

1. Draw an AC model for the log filter section. As demonstrated with respect to FIG. 3B the analysis is simplified if a battery is placed in series with each diode to overcome its quiescent forward voltage drop. From equation (7) it can be seen that the equation relating the voltage and current in this diode-battery combination becomes:

$$I_D = I_Q e^{40 V_D} \qquad (15)$$

wherein
$I_D$ = the diode current;
$I_Q$ = the quiescent diode current; and
$V_D$ = the voltage cross the diode-battery combination.

2. Write a set of node equations for the filter section.
3. Eliminate any isolated linear derivative terms in each node equation by multiplying by an exponential as shown as follows:

$$I + V_1' = e^{V_2} \qquad (16)$$

multiply by $e^{V_1}$ to eliminate $V_1'$ so that equation 15 becomes $$e^{V_1} + V_1' e^{V_1} = e^{V_1} \cdot e^{V_2}, \qquad (17)$$

$$e^{V_1} + (e^{V_1})' = e^{V_1} \cdot e^{V_2} \qquad (18)$$

4. Eliminate the intermediate node voltages by combining the node equations.
5. Finally, substitute equations (2A) and (B 3A) previously derived into the filter section equations to arrive at the final differential equation. The nonlinear error term, if any, appearing in the final differential equation is thus an indication of the distortion characteristics of the log domain filter network thus provided.

The design approach can be utilized to provide the more complex filter configurations of FIGS. 5-10. Although the differential equations for each of the respective eombodiments shown in FIGS. 5-7 is given below only in its final form, the derivation of the equations can be provided in accordance with the mathematic analysis techniques described above.

Referring to FIG. 5A, the linear network comprises two cascaded RC low pass filter sections, wherein the input terminal 70 is connected to resistor 72 which in turn is connected to ground through capacitor 74 (resistor 72 and capacitor 74 forming the first low pass filter section) and to resistor 76 of the second low pass filter section. Resistor 76 is in turn connected to ground through capacitor 78 of the second section and to the output terminal 80. Assuming that the values of resistors 72 and 76 are equal, the equivalent log domain filter 32C is provided by substituting diodes 82 and 84 for the respective resistors 72 and 76, and placing the modified section between the log converter 10 and the level shifter buffer 38C as shown in FIG. 5B. An additional feedback diode 86 is connected in the feedback path of operational amplifier 50 of the buffer 50, i.e. connected in series with diode 52 due to the additonal diode drop provided by the additional diode 84 of the network section 32C.

With the configuration shown the nominal control current $I_c$ to sink 34 is set so that it equals $1/40R$, where R is the resistance value of resistors 72 and 76. The final differential equation for the filter section shown in FIG. 5A is as follows:

$$V_o + V_o' R(2C_2 + C_1) + V_o'' R^2 C_1 C_2 = V_{IN} \quad (19)$$

wherein $V_{IN}$ = the input voltage applied to input terminal 6 of log converter 10;

$V_o$ = the output voltage at output terminal of antilog converter 20;

$V_o'$ = the first derivative with respect to time of the output voltage $V_o$;

$V_o''$ = the second derivative with respect to time of the output voltage $V_o$;

R = the value of each of the resistors 72 and 76;

$C_1$ = the value of capacitor 74; and $C_2$ = the value of capacitor 78.

The corresponding differential equation of the equivalent log domain filter shown in FIG. 5B is:

$$I_o + I_o' \left( \frac{2C_2 + C_1}{40I_c} \right) + I_o'' \left( \frac{C_1 C_2}{(40I_c)} 2 \right) + \left( \frac{C_2}{40I_c} \right)^2 \cdot \frac{(I'_o)^2}{I_o} = I_{IN} \quad (20)$$

wherein $I_{IN}$ = the input current to the log converter 10;

$I_o$ = the output current through diode of the antilog converter 24;

$I_o'$ = the first derivative with respect to time of the output current $I_o$;

$I_o''$ = the second derivative with respect to time of the output current $I_o$; and $I_c$ = the nominal current through diodes 82 and 84 provided by the sinks 34 and 38.

The error or nonlinear term $$\left( \frac{C_2}{40I_2} \right)^2 \cdot \frac{(I'_o)^2}{I_o}$$

indicates that the resulting circuit of FIG. 5B produces a second harmonic distortion product when the input frequency of $I_{IN}$ approaches the cutoff frequency determined by $I_c$. The magnitude of this specific term is a function of the input current level, and is generally less than 1%.

Referring to FIG. 6A, a linear Sallen and Key filter is shown. As well known the linear filter has an input terminal 90 connected to input resistor 92, which in turn is connected through resistor 94 to the positive input terminal of operational amplifier 96, the latter terminal being connected to ground through capacitor 98. The negative input of amplifier 96 is connected directly to its output terminal 100 which forms the output of the filter, terminal 100 being connected through feedback capacitor 102 to the function formed between resistors 92 and 94. In accordance with the present invention as shown in FIG. 6B, long filter section 32D is formed by substituting diodes 104 and 106 for the corresponding resistors 92 and 94 and the amplifier 50 of the buffer 36D is utilized for both the filter component and buffer. In regard to the latter function, it is noted that two diodes 52 and 86 are utilized in the feedback path of amplifier 50 to correct for the drops across the two diodes 104 and 106. The final differential equation of the linear filter shown in FIG. 5A is as follows:

$$V_o + V_o'(2RC_2) + V_o''(R^2 C_1 C_2) = V_{in} \quad (20)$$

wherein $V_{in}$ = the input voltage applied to the input terminal 6 of the log converter;

$V_o$ = the voltage output at output terminal of the antilog converter;

$V_o'$ = the first derivative with respect to time of the output voltage;

$V_o''$ = the second derivative with respect to time of the output voltage;

R = the value of each resistor 92 and 94;

$C_1$ = the value of capacitor 102; and $C_2$ = the value of capacitor 98.

The center frequency $\omega_o$ of the filter is defined as $$\omega_o = \frac{1}{R \sqrt{C_1 C_2}} \quad (21)$$

and the Q of the filter is defined as $$Q = \frac{1}{2} \sqrt{\frac{C_1}{C_2}} \quad (22)$$

In this situation the error term in the corresponding differential equation of the equivalent log domain filter 32D shown in FIG. 6B is $$\frac{(I'_o)^2}{I_o} \cdot \frac{(C_2^2 - C_1 C_2)}{(40I_c)^2} \quad (23)$$

and the center frequency $\omega_o$ and the Q are respectively $$\omega_o = \frac{40I_c}{\sqrt{C_1 C_2}}, \quad (24)$$

and $$Q = \frac{1}{2}\sqrt{\frac{C_1}{C_2}} \quad (25)$$

From equations (23), (24) and (25) it will be readily apparent that the distortion term of (23) disappears if Q is set to 0.5, i.e., $C_1 = C_2$; and is very low for Q's ranging from 0.3 to 1.5, a fact which makes this particular filter configuration particularly useful for audio use.

Figure 7B:
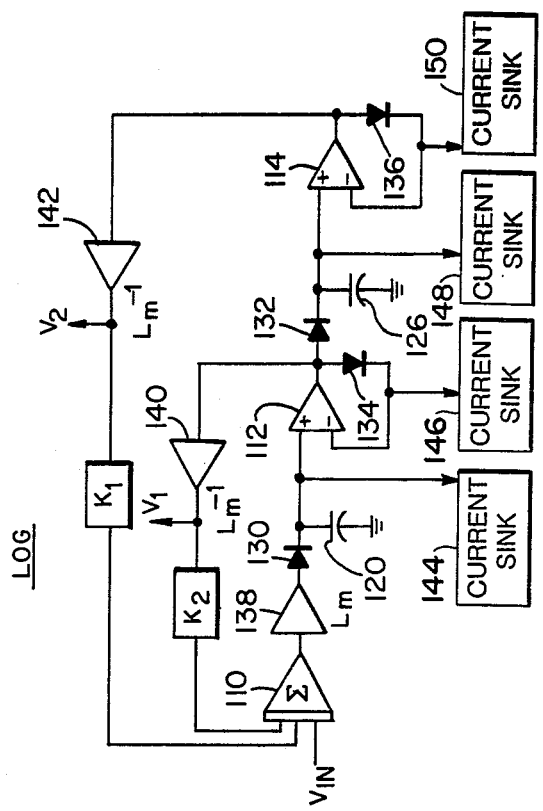
Figure 7A:
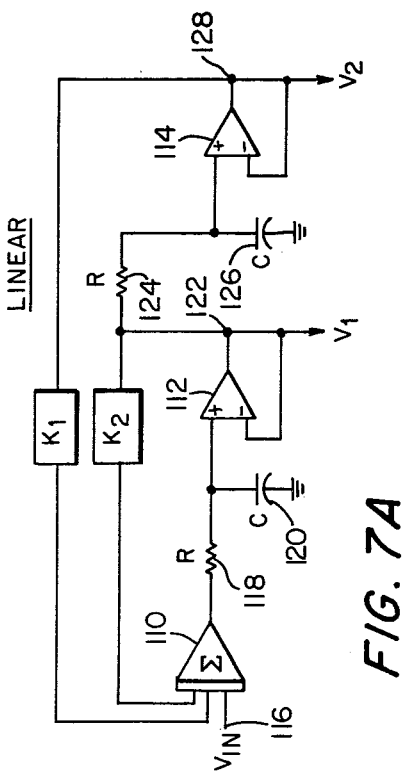
Figure 8:
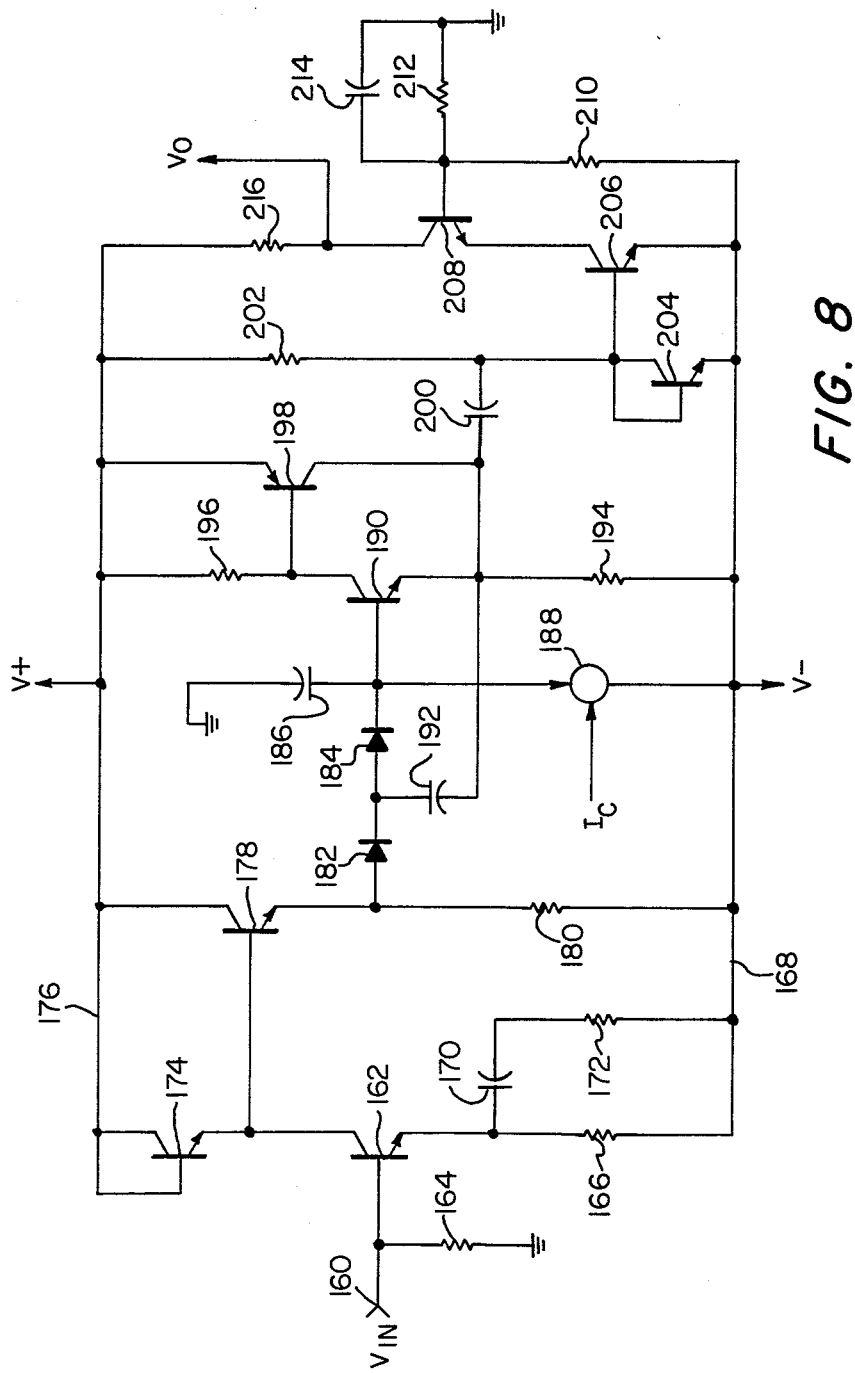
FIG. 8 shows in schematic form, a discrete high frequency filter network designed in accordance with the present invention.

Referring to FIG. 7A, a linear state variable filter is schematically shown. Generally, the state variable filter shown includes a summing amplifier and two integrators. In particular, the input terminal 116 is connected to an input of summing amplifier 110 which in turn is connected to an input of summing amplifier 110 which in turn is connected to resistor 118. The latter is connected through capacitor 120 to ground and to the positive input of amplifier 112. The output terminal 122 of amplifier 112 is connected to its negative input terminal, through an impedance $K_2$ (which determines the Q of the filter) to a second input of summing amplifier 110, and through resistor 124 to the positive input of amplifier 114. Output terminal 122 provides a bandpass output signal $V_1$ as well known in the art. The positive input of amplifier 114 is connected to ground through capacitor 126, while the output terminal 128 of the amplifier is connected to its negative input and through impedance $K_1$ (which in part determines the frequency cut off of the low pass output $V_2$ at terminal 128.) to the third input terminal of summing amplifier 110. The use of the RC network of resistor 118 and capacitor 120 with amplifier 112, and the RC network of resistor 124 and capacitor 126 with amplifier 114, function as integrators. The state variable filter can be employed in the log domain as shown in FIG. 7B (the log and antilog converters being omitted from the drawing for ease of exposition).

In particular diodes 130 and 132 replace resistors 118 and 124, respectively, and diodes 134 and 136 are provided in the respective feedback paths of amplifiers 112 and 114. It will be appreciated that it is not possible to utilize feedback within the log domain unless feedback gain is at unity. Accordingly, a suitable gain amplifier 138 is connected between the output of summing amplifier 110 and the diode 130, while inverting amplifiers 140 and 142 are connected in the respective feedback paths between the output of amplifier 112 and the impedance $K_2$, and between the output of amplifier 114 and impedance $K_1$. In this case the band pass output $V_1$ is provided at the output terminal of inverting amplifier 140 and the low pass output $V_2$ is provided at the output terminal of inverting amplifier 142. The control current sinks 144 and 146 are connected to the positive and negative inputs of amplifier 112 for controlling the band pass cutoff of the output signal $V_1$, while current sinks 148 and 150 are connected to the positive and negative inputs of amplifier 114 for controlling the low-pass cutoff frequency of the output $V_2$.

The teachings of the present invention can be applied to discrete components as well as those circuits utilizing $I_C$ components, as previously described. For example, the circuit shown in FIG. 8 eliminates all operational amplifiers and solely employs discrete components so as to enhance the high frequency transmission in the log domain.

The input signal $V_{IN}$ is applied to input terminal 160 which is connected to the base of transistor 162, the base being biased to ground through resistor 164. The emitter of transistor 162 is connected through resistor 166 to the negative voltage rail 168, and to capacitor 170 which in turn is connected through resistor 172 to the rail 168. The collector of transistor 162 is connected to the emitter of transistor 174, the latter having its base and collector tied together and to the positive voltage rail 176. The collector of transistor 162 and emitter of transistor 174 are also connected to the base of transistor 178. The collector of transistor 178 is connected to rail 176, while the emitter is connected through resistor 180 to the negative rail 168. The emitter of transistor 178 is also connected to the anode of diode 182, which in turn has its cathode connected to the anode of diode 184. The cathode of diode 184 is connected to ground through capacitor 186, to the control current sink 188 (which in turn is connected to the negative voltage rail 168) and to the base of transistor 190. The emitter of transistor 190 is connected through feedback capacitor 192 to the junction formed by the cathode of diode 182 and the anode of diode 184, and through resistor 194 to the negative voltage rail 168. The collector of transistor 190 is connected through resistor 196 to the positive voltage rail and the base of transistor 198. The emitter of transistor 198 is connected to the positive voltage rail 176 and the collector is connected the positive voltage rail 176 and the collector is connected to the emitter of transistor 190 and to the capacitor 200. The latter is connected through resistor 202 to the positive voltage rail 176 and to the collector of transistor 204 and to the base of transistor 206. Transistor 204 has its base and collector tied together and its emitter connected to the negative voltage rail 168. The transistor 206 has its emitter connected to the negative voltage rail 168 and its collector to the emitter of transistor 208. The base of transistor 208 is connected through resistor 210 to the negative voltage rail 168, and through each of the resistor 212 and capacitor 214 to ground. The collector of transistor 208 is connected through resistor 216 to the positive voltage rail and forms the output terminal for providing the output signal $V_o$.

In operation the input voltage $V_{IN}$ applied to input terminal 160 is converted to a current by resistor 172, which current is applied to logging transistor 174. The log voltage output produced by transistor 174 is buffered by transistor 178 and fed to the log domain filter section at the anode of diode 182. The log filter section is a Sallen and Key type configuration as previously described with reference to FIG. 6B, since it includes diodes 182 and 184, capacitors 186 and 192 and amplifying transistor 190 in the general configuration shown in FIG. 6B. The output of the filter section feeds a two transistor buffer (formed by transistors 190 and 198) which in turn is capacitively coupled through capacitor 200 into a cascaded antilog converter provided by transistors 204, 206 and 208.

The circuit shown is capable of operation at frequencies as high as 10 MHz. The amount of enhancement of the high frequency output of the circuit shown is determined in part by the gain-bandwidth product of the anti-log converter. High frequency performance can be maximized by keeping the input and output voltages at fairly low magnitudes and designing the input stage to provide a large amount of transconductance gain. This allows the anti-log converter to operate with low voltage gain and large bandwidth.

Figure 9:
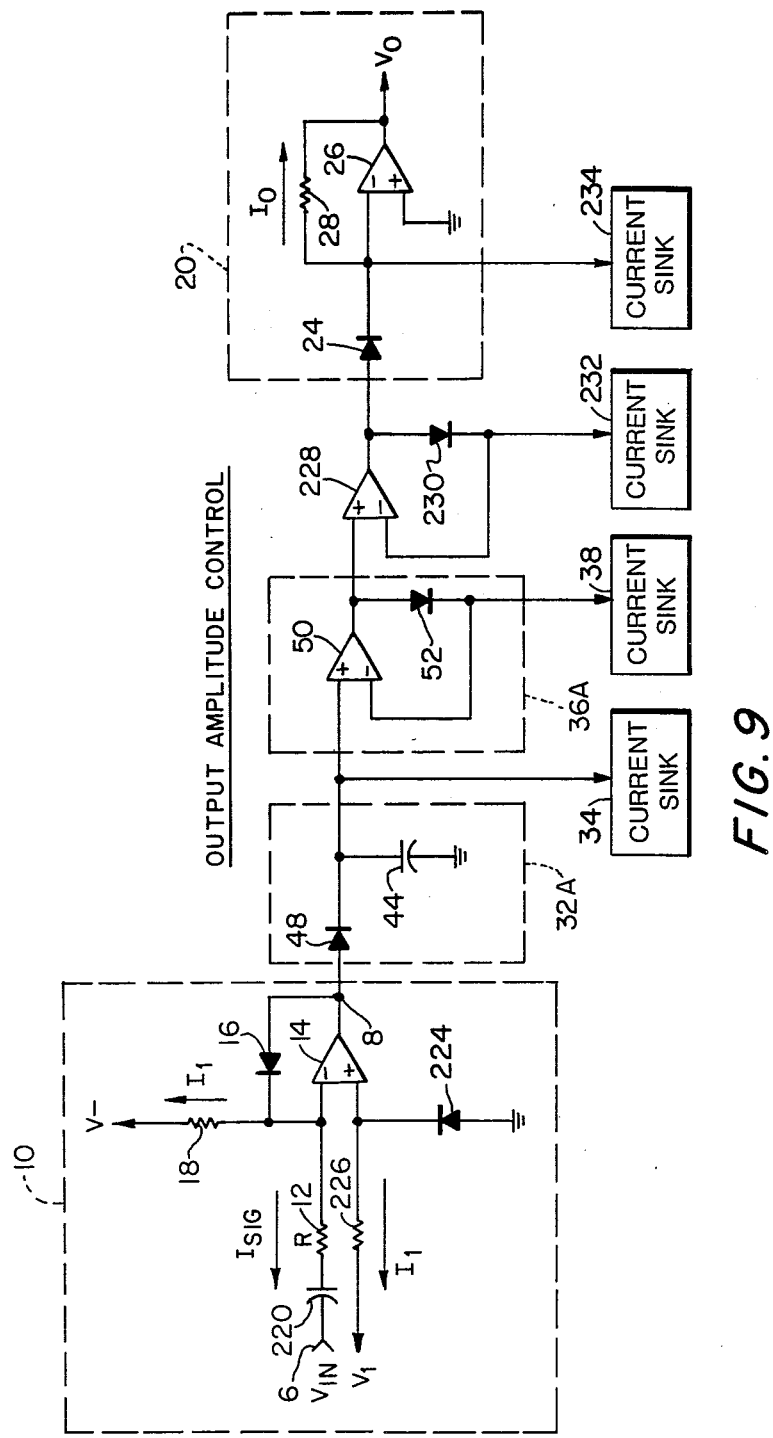
FIG. 9 shows in schematic form the embodiment of FIG. 2B further modified to include means for providing a signal-controllable signal gain, and FIGS. 10A and 10B respectively show in schematic form a known linear oscillator circuit network and the equivalent log circuit network designed in accordance with the present invention for use in the log domain.

It should be readily appreciated that since networks designed in accordance with the present invention operate in the log domain they can in at least some instances where operation at unity gain is not a required operating condition, be adapted to also control signal gain. For example, as shown in FIG. 9, the low pass filter of FIG. 2B has been modified so as to also control signal gain.

In particular, an input capacitor 220 is connected between input terminal 6 and input resistor 12 for converting the input voltage $V_{IN}$ to an input signal current $I_{sig}$. In addition the log converter is modified by connecting the positive input of amplifier 14 to the cathode of diode 224, (which in turn has its anode connected to ground) and through resistor 226 to a negative reference voltage $V_1$ so as to produce a current $I_1$ through resistor 226.

The circuit is further modified in order to add a gain control signal to the log signal provided by the log domain filter section 32A and buffer section 36A. In particular, the output of amplifier 50 is connected to the positive input of amplifier 228. The output of the latter is connected to the antilog converter 20 and to the anode of feedback diode 230. The cathode of diode 228 is connected to negative input terminal of amplifier 228 and to current sink 232. In addition the cathode of diode 29 of the antilog converter is connected to current sink 24.

In operation the current provided by sink 232 is added to the log signal current output of amplifier 50. In this regard the control current from source 232 functions as a multiplier since the log signal output is in the log domain. Specifically, when the combined signal is converted to its antilog by converter 20 the addition of the two signals in the log domain is in effect a multiplication in the linear domain. As shown, the output current of the antilog converter 20 equals the product of the current control signal from sink 232 multiplied by the current signal input of the log converter, divided by the current through resistor 226.

It should be appreciated that in addition to filtering networks the principles of the present invention can be applied to other types of circuits such as oscillators and voltage controlled phase shifters. For example, a linear phase-shift oscillator and its equivalent log circuit are respectively shown in FIGS. 10A and 10B.

Figure 10A:
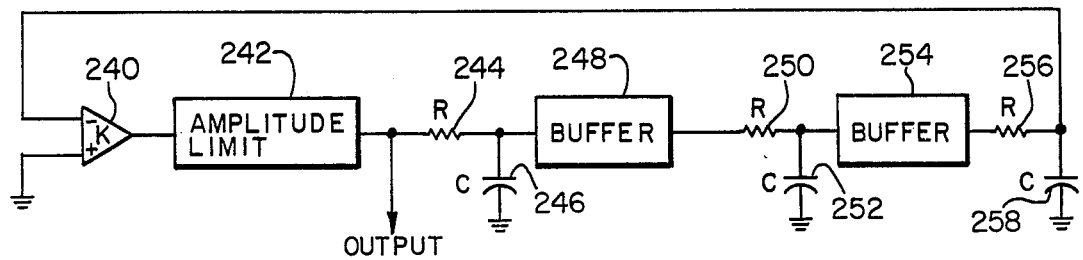

The linear model shown in FIG. 10A comprises operational amplifier 240 including its own voltage source (not shown) and having its positive input grounded. The output of amplifier 240 is connected to the amplitude limit 242 for limiting the amplitude of the oscillating output. The output of limit 242 is connected through a feedback circuit to the negative input of amplifier 240. In particular, the output of limit 242 is connected to resistor 244 which in turn is connected through capacitor 246 to ground and directly to buffer 248. The output of buffer 248 is connected to resistor 250, which in turn is connected through capacitor 252 to ground and directly to buffer 254. The buffer 254 is connected to resistor 256. The latter is connected to ground through capacitor 258 and directly to the negative input of amplifier 240. As well known the frequency and phase output of the oscillator is determined by the values of resistors 244, 250 and 256 and capacitors 246, 252 and 258.

Figure 10B:
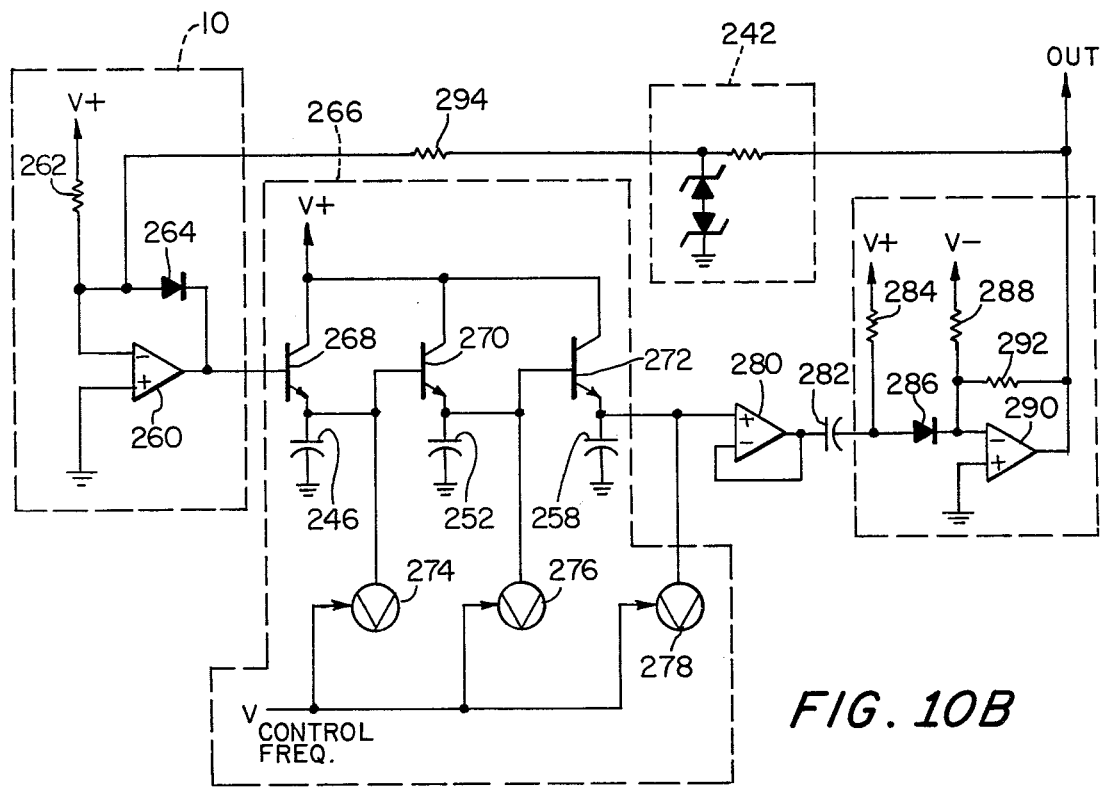

Referring to FIG. 10B, a log converter 10 is provided by operational amplifier 260 having its positive input connected to ground and its negative input connected through biasing resistor 262 to a positive DC biasing voltage and to the anode of feedback diode 264, the latter having its cathode connected to the output of amplifier 260. The output of amplifier 260 is connected to the log domain phase shift section 266.

In particular the resistors 244, 250 and 256 are replaced by NPN transistors 268, 270 and 272 respectively, all of the transistors having their collectors connected to a common positive DC voltage source. The transistors serve as the equivalent diodes as well as buffers 248 and 254. In particular, the output of amplifier 260 of the log converter 10 is connected to the base of transistor 268, while the emitter of the transistor is connected to ground through capacitor 246. The emitter of transistor 268 is also connected to a control signal source 274 and to the base of transistor 270. Similarly, the emitter of transistor 270 is connected to ground through capacitor 252, to control signal source 276 and to the base of transistor 272, while the emitter of transistor 272 is connected to ground through capacitor 258, to control signal source 278 and to the positive input of an AC buffer stage 280. The output of buffer stage 280 is connected to its negative input and to capacitor 282. The latter in turn is connected to the antilog converter 20, i.e., through biasing resistor 284 to a positive DC voltage bias source and to the anode of diode 286. The cathode of the diode is connected through biasing resistor 288 to a negative DC voltage bias source and to the negative input of operational amplifier 290 of the antilog converter 20. The positive input of amplifier 290 is connected to ground and the output of amplifier 290 is connected through feedback resistor 292 and provides the output of the equivalent phase shift oscillator of FIG. 10A. The output of amplifier 290 is also connected in a feedback path to the negative input of amplifier 260 of the log converter 10. In particular, the output is connected through amplitude limit control 242, to resistor 294, the latter being connected to the negative input terminal of amplifier 260.

The present invention thus provides advantages by presenting a new class of networks operable in the log domain. The networks are inherently signal-controllable in both frequency and output amplitude over a range of at least 1000:1.

The examples of the networks described and shown in the drawings and designed in accordance with the present invention represent just a small portion of the possible log domain circuits that can be provided. One possibility which arises is the concept of non-linear signal processing. The networks designed for use in the log domain have a signal controllable frequency response identical to the corresponding RC networks for use in the linear frequency domains. In the log domain it is a simple matter to raise a function to a power by simply multiplying the log wave form by a constant as taught in U.S. Pat. No. 3,681,618 issued to Blackmer on Aug. 1, 1972 so that signal gain control can easily be provided.

Since certain changes may be made in the above apparatus and process without departing from the scope of the invention herein involved, it is intended that all matter contained in the above description or shown in the accompanying drawing shall be interpreted in an illustrative and not in a limiting sense.

What is claimed is:

1. A system for processing an input signal and having a variable system frequency response, said system comprising:

signal log converting means responsive to said input signal for providing a first log signal as a function of the logarithm of said input signal;

filter means coupled to said signal log converting means and responsive to said log signal and a control signal for providing a modified log signal as a function of said first log signal and said control signal; and signal antilog converting means coupled to said filter means and responsive to said modified log signal for providing an antilog signal as a function of the antilogarithm of said modified log signal;

wherein said variable system frequency response includes a cut-off frequency as a function of said control signal.

2. A system according to claim 1, wherein said system frequency response includes a cut-off frequency proportional to the D.C. amplitude level of said control signal.

3. A system according to claim 2 wherein said cut-off frequency is directly proportional to said D.C. amplitude.

4. A system for processing an input signal and having a variable system frequency response, said system comprising:

signal log converting means responsive to said input signal for providing a first log signal as a function of the logarithm of said input signal;

filter means including at least one diode coupled to at least one capacitor, said filter means being coupled to said signal log converting means and responsive to said log signal and a control signal so as to provide a modified log signal as a function of said first log signal and said control signal; and signal antilog converting means coupled to said filter means and responsive to said modified log signal for providing an antilog signal as a function of the antilogarithm of said modified log signal;

wherein said variable system frequency response varies as a function of said control signal and said diode is biased by said control signal.

5. A system according to claim 4, wherein said control signal is a control current and said system frequency response includes a cut-off frequency approximately equal to $40Ic/(2\pi C)$ wherein $Ic$ = the D.C. amplitude of said control current, and C = the value of said capacitor.

6. A system for processing an input signal and having a variable system frequency response, said system comprising:

signal log converting means responsive to said input signal for providing a first log signal as a function of the logarithm of said input signal;

filter means including a low pass filter section, said filter means being coupled to said signal log converting means and responsive to said log signal and a control signal so as to provide a modified log signal as a function of said first log signal and said control signal; and signal antilog converting means coupled to said filter means and responsive to said modified log signal for providing an antilog signal as a function of the antilogarithm of said modified log signal;

wherein said antilog signal includes substantially only low frequency energy below a cut-off frequency linearly proportional to and as a function of said control signal.

7. A system for processing an input signal and having a variable system frequency response, said system comprising:

signal log converting means responsive to said input signal for providing a first log signal as a function of the logarithm of said input signal;

filter means including a low frequency filter section for transmitting a low frequency component of said log signal, said filter means being coupled to said signal log converting means and responsive to said log signal and a control signal so as to provide a modified log signal as a function of said low frequency component of said log signal and said control signal;

signal antilog converting means coupled to said filter means and responsive to said modified log signal for providing an antilog signal as a function of the antilogarithm of said modified log signal; and means for subtracting said antilog signal from said input signal so as to provide an output signal;

wherein said variable system frequency response varies as a function of said control signal.

8. An oscillator system for providing an output signal at a predetermined oscillating frequency as a function of a control signal, said system comprising:

signal log converting means including an input terminal for receiving said input signal, said log converting means being responsive to said input signal so as to provide a first log signal as a function of the logarithm of said input signal;

filter means coupled to said signal log converting means and responsive to said log signal and said control signal for providing a modified log signal as a function of said first log signal and said control signal;

signal antilog converting means coupled to said filter means, and including an output terminal for providing said output signal, said antilog converting means being responsive to said modified log signal so as to provide said output signal as a function of the antilogarithm of said modified log signal; and a feedback path coupled between said input and output terminals so that said system functions as an oscillator;

wherein said oscillating frequency is a function of said control signal.

9. A system for processing an input signal and having a variable system frequency response, said system comprising:

signal log converting means responsive to said input signal for providing a first log signal as a function of the logarithm of said input signal;

filter means coupled to said signal log converting means and responsive to said log signal and a first control signal for providing a modified log signal as a function of said first log signal and said control signal;

summing means for summing a second control signal with said modified log signal so as to provide a second modified log signal;

signal antilog converting means coupled to said summing means and responsive to said second modified log signal for providing an antilog signal as an antilogarithmic function of said second modified log signal;

wherein said variable system frequency response varies as a function of said first control signal.

* * * * *